(12) United States Patent
Lim et al.

(10) Patent No.: US 10,176,746 B2
(45) Date of Patent: Jan. 8, 2019

(54) DISPLAY DEVICE, GATE DRIVER AND METHOD OF DRIVING GATE DRIVER

(71) Applicant: LG DISPLAY CO., LTD., Seoul (KR)

(72) Inventors: Yu Sok Lim, Seoul (KR); Hyerin Kim, Cheongju-si (KR)

(73) Assignee: LG Display Co., Ltd., Seoul (KR)

(*) Notice: Subject to any disclaimer, the term of this patent is extended or adjusted under 35 U.S.C. 154(b) by 71 days.

(21) Appl. No.: 15/387,056

(22) Filed: Dec. 21, 2016

(65) Prior Publication Data

US 2018/0033363 A1 Feb. 1, 2018

(30) Foreign Application Priority Data

Jul. 29, 2016 (KR) .......................... 10-2016-0096816

(51) Int. Cl.
*G09G 3/00* (2006.01)
*G09G 3/20* (2006.01)
*G11C 19/28* (2006.01)

(52) U.S. Cl.
CPC .............. *G09G 3/2092* (2013.01); *G09G 3/20* (2013.01); *G11C 19/28* (2013.01); *G09G 2310/0267* (2013.01); *G09G 2310/0286* (2013.01); *G09G 2310/0289* (2013.01); *G09G 2310/08* (2013.01)

(58) Field of Classification Search
CPC ............. G09G 3/2092; G09G 2310/08; G09G 2310/0289
See application file for complete search history.

(56) References Cited

U.S. PATENT DOCUMENTS

| 2009/0303211 | A1* | 12/2009 | Hu | .......................... G11C 19/28 345/204 |
| 2015/0187298 | A1* | 7/2015 | Eom | ...................... G11C 19/28 345/99 |
| 2015/0317954 | A1* | 11/2015 | Jang | .......................... G09G 3/20 345/213 |

FOREIGN PATENT DOCUMENTS

| JP | 2011-209714 A | 10/2011 |
| WO | 2012-161042 A1 | 11/2012 |
| WO | 2014-054517 A1 | 4/2014 |

* cited by examiner

*Primary Examiner* — Muhammad N Edun
(74) *Attorney, Agent, or Firm* — Seed Intellectual Property Law Group LLP (57) ABSTRACT

Provided is a gate driver and a method of driving the same, which enables a voltage level of a Q node to be stably maintained in a blank section by: inputting a clock signal that directly provides a high level to the Q node through a reset signal input end of a reset signal for resetting the Q node of a gate driver integrated circuit; inputting a reset signal for each blank section between frames; or providing a higher gate high voltage and a lower gate low voltage. There may be provided a gate driver integrated circuit that has a robust structure with high reliability and avoids an error of a scan signal by maintaining the voltage level of the Q node to be stable in the blank section, and a method of driving the same.

19 Claims, 11 Drawing Sheets

Malfunction in Scan2 Output

Determine normal waveform

DISPLAY DEVICE, GATE DRIVER AND METHOD OF DRIVING GATE DRIVER

CROSS REFERENCE TO RELATED APPLICATION

This application claims priority from Korean Patent Application No. 10-2016-0096816, filed on Jul. 29, 2016, which is hereby incorporated by reference for all purposes as if fully set forth herein.

BACKGROUND

Technical Field

The embodiments relate to a display device, a gate driver included in the display device, and a method of driving the gate driver.

Description of the Related Art

As information oriented society has developed, demands for various types of display devices for displaying an image have increased. Accordingly, various types of display devices, such as a liquid crystal display device, a plasma display device, an organic light emitting display device, and the like, have been utilized.

The display device includes: a display panel in which a plurality of gate lines and a plurality of data lines are disposed, and a plurality of pixels are defined on the intersections at which the gate lines and the data lines intersect; a gate driver configured to drive a gate line; a data driver configured to drive a data line; a controller configured to control the gate driver and the data driver; and the like.

The gate driver sequentially drives a plurality of gate lines by outputting a scan signal to the plurality of gate lines. The data driver outputs a data voltage to a data line at a timing of a scan signal output by the gate driver, and drives each pixel.

Therefore, the gate driver requires high reliability to drive the display device. However, when the display device has high specifications and is provided in a large size, the gate driver malfunctions as the gate driver drives for a long time, which is a drawback.

BRIEF SUMMARY

An aspect of the embodiments of the present disclosure is to provide a gate driver that has high reliability and does not malfunction even though the gate driver drives for a long time, and a method of driving the gate driver.

Another aspect of the embodiments of the present disclosure is to provide a structure of a gate driver that maintains voltages of a Q node and a QB node of a gate driver to be stable, and a method of driving the gate driver.

In accordance with an aspect of the present disclosure, there is provided a gate driver, including: a first transistor that is connected with a Q node, and is configured to operate based on a voltage of the Q node; and a second transistor that is connected with a QB node, and is configured to operate based on a voltage of the QB node.

The gate driver outputs a scan signal to a gate line that is disposed in a display panel, according to operations of the first transistor and the second transistor.

The gate driver includes: a control circuit unit that controls voltage levels of the Q node and the QB node, wherein a signal line, to which a reset signal for resetting the Q node is input, is connected with a clock signal input end of a clock signal that directly provides a high level to the Q node.

The clock signal may be a signal for controlling a transistor that is connected between a gate low voltage input end and the QB node, and the voltage of the Q node may be maintained to be regular during a blank section by providing a clock signal through the signal line to which a reset signal is input.

A transistor may be connected with the signal line to which a reset signal is input, and a drain node and a gate node of the transistor connected with the signal line may be connected with each other.

Also, a capacitor that is connected between a gate high voltage input end and the Q node may be further included.

In this instance, a gate high voltage that is a predetermined voltage higher than a reference gate high voltage may be provided to the gate high voltage input end, and a gate low voltage that is a predetermined voltage lower than a reference gate low voltage may be simultaneously provided to the gate low voltage input end.

In accordance with another aspect of the present disclosure, there is provided a gate driver, including: a first transistor that is connected with a Q node, and is configured to operate based on a voltage level of the Q node; a second transistor that is connected with a QB node, and is configured to operate based on a voltage level of the QB node; and a control circuit unit configured to control voltage levels of the Q node and the QB node, wherein the control circuit unit provides a reset signal for resetting the Q node for each blank section between frames.

The voltages of the Q node and the QB node are maintained to be stable in a blank section by providing a reset signal for resetting the Q node for each blank section.

In accordance with another aspect of the present disclosure, there is provided a display device, including: a display panel in which a plurality of gate lines and a plurality of data lines are disposed; a gate driver configured to drive the plurality of gate lines; and a data driver configured to drive the plurality of data lines, wherein the gate driver is configured to output a gate signal based on a voltage level of a Q node and a voltage level of a QB node, and a signal line, to which a reset signal for resetting the Q node is input, is connected with a clock signal input end of a clock signal that directly provides a high level to the Q node.

In accordance with another aspect of the present disclosure, there is provided a method of driving a gate driver, the method including: outputting a gate start signal; outputting a gate signal (scan signal) based on a voltage level of a Q node and a voltage level of a QB node; and outputting a reset signal for resetting the Q node for each blank section between frames.

According to one or more embodiments of the present disclosure, a voltage of a Q node may be maintained to be stable during a blank section by connecting a signal line, to which a reset signal for resetting the Q node is input, with a clock signal input end of a clock signal that directly provides a high level to the Q node.

According to one or more embodiments of the present disclosure, a voltage of a Q node is maintained to be stable during a blank section by: outputting a reset signal for resetting the Q node for each blank section; or providing a gate high voltage that is higher than a reference gate high voltage, and simultaneously providing a gate low voltage that is lower than a reference gate low voltage.

According to one or more embodiments of the present disclosure, a voltage of a Q node is maintained to be stable during a blank section, and thus, there is provided a gate driver that is highly reliable even when driving for a long time and a method of driving the gate driver.

BRIEF DESCRIPTION OF THE SEVERAL
VIEWS OF THE DRAWINGS

The above and other objects, features, and advantages of the present disclosure will be more apparent from the following detailed description taken in conjunction with the accompanying drawings, in which.

DETAILED DESCRIPTION

Hereinafter, embodiments of the present disclosure will be described in detail with reference to the accompanying drawings. In designating elements of the drawings by reference numerals, the same elements may be designated by the same reference numerals although they are shown in different drawings. Further, in the following description of the present disclosure, a detailed description of known functions and configurations incorporated herein may be omitted when it may make the subject matter of the present disclosure rather unclear.

In addition, terms, such as first, second, A, B, (a), (b) or the like may be used herein when describing components of the present disclosure. These terms are merely used to distinguish one component from other components, and the property, order, sequence and the like of the corresponding component are not limited by the corresponding term. In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 1:
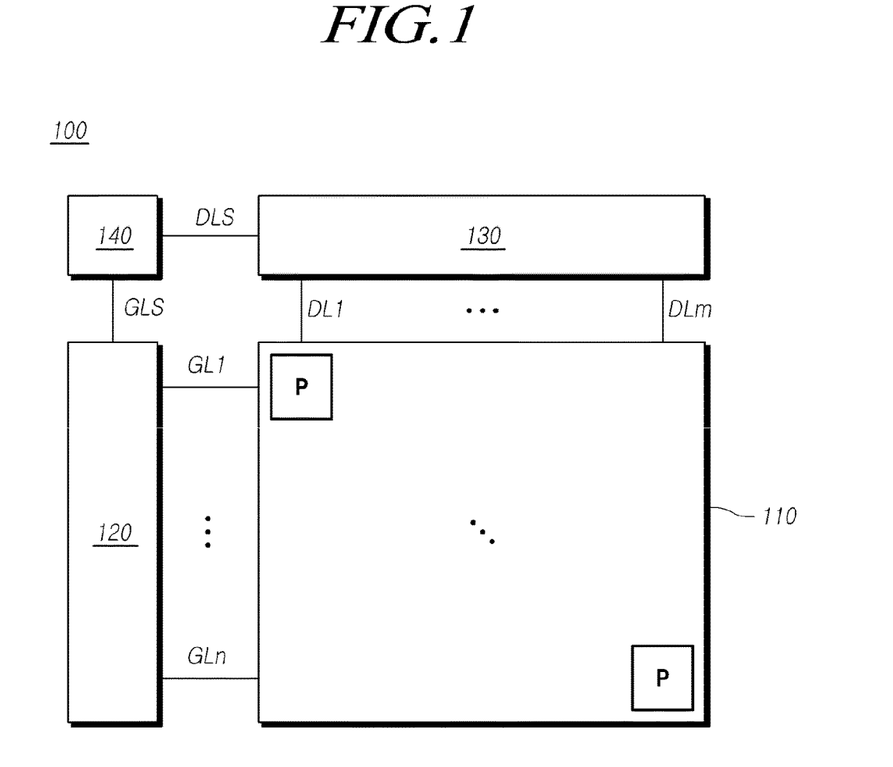
FIG. 1 is a diagram illustrating a schematic configuration of a display device according to embodiments of the present disclosure.

FIG. 1 is a diagram illustrating a schematic configuration of a display device 100 according to embodiments of the present disclosure.

Referring to FIG. 1, the display device 100 according to embodiments of the present disclosure includes: a display panel 110 in which a plurality of gate lines (GL) and a plurality of data lines (DL) are disposed, and a plurality of pixels are disposed on intersections at which the gate lines (GL) and the data lines (DL) intersect; a gate driver 120 that drives the plurality of gate lines (GL); a data driver 130 that provides a data voltage to the plurality of data lines (DL); and a controller 140 that controls the driving of the gate driver 120 and the data driver 130.

The gate driver 120 sequentially provides a scan signal to the plurality of gate lines (GL), thereby sequentially driving the plurality of gate lines (GL).

The data driver 130 supplies a data voltage to the plurality of data lines (DL), and drives the plurality of data lines (DL).

The controller 140 supplies various control signals to the gate driver 120 and the data driver 130, and controls the gate driver 120 and the data driver 130.

The controller 140 starts scanning according to a timing implemented in each frame, converts image data input from the outside to be appropriate for a data signal format used by the data driver 130, outputs the converted image data, and controls driving of data at a proper time based on the scanning.

The gate driver 120 sequentially supplies a scan signal of an on-voltage or an off-voltage to the plurality of gate lines (GL) based on the control of the controller 140, and sequentially drives the plurality of gate lines (GL).

The gate driver 120 may be located in one side of the display panel 110, or may be located in both sides, depending on a driving scheme.

Also, the gate driver 120 may include one or more gate driver integrated circuits.

Each gate driver integrated circuit may be connected to a bonding pad of the display panel 110 based on a tape automated bonding (TAB) scheme or a chip on glass (COG) scheme, or may be embodied as a gate in panel (GIP) type and may be directly disposed on the display panel 110.

Also, the gate driver integrated circuit may be disposed by being integrated with the display panel 110, or may be embodied based on a chip on film (COF) scheme so that the gate driver integrated circuit is mounted on a film connected with the display panel 110.

Hereinafter, for ease of description, descriptions will be provided by assuming that one or more gate driver integrated circuits included in the gate driver 120 is of a type of GIP, and the gate driver integrated circuit may be written as a gate driver IC in panel (GIP).

Figure 2:
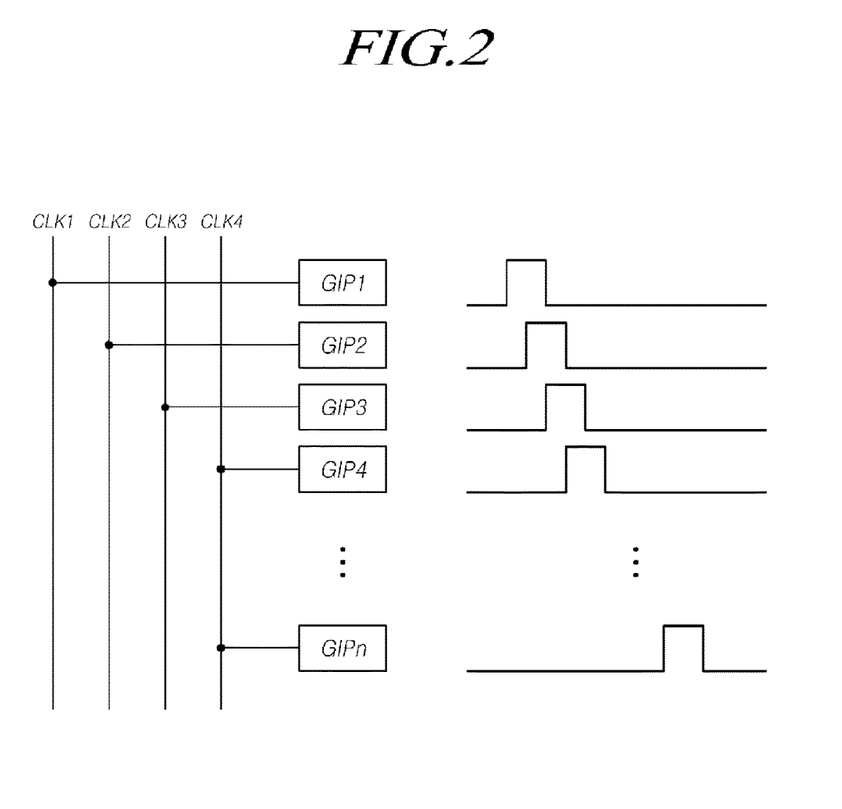
FIGS. 2 and 3 are diagrams illustrating a schematic configuration of a gate driver according to embodiments of the present disclosure.

In this instance, as illustrated in FIG. 2 which shows an example of the gate driver 120, a plurality of gate driver integrated circuits embodied as a GIP type are disposed in the display panel 110, and drive the plurality of gate lines (GL) disposed in the display panel 110.

The gate driver integrated circuit receives an input, such as a gate start signal (VST), a clock signal (CLK), a reset signal (RST), or the like, and generates a scan signal based on the inputted signal.

The gate driver integrated circuit sequentially outputs a generated scan signal to a plurality of gate lines (GL), and drives the gate lines (GL).

In FIG. 2, it is illustrated that the number of the gate driver integrated circuits is n, which is the same as the number n of gate lines (GL) (n). However, the number of gate driver integrated circuits may be different from the number n of gate lines (GL), depending on a driving scheme of the gate driver 120 (e.g., the number of the gate lines may be 2n).

When a predetermined gate line (GL) is open, the data driver 130 converts image data received from the controller 140 into a data voltage of an analog type, supplies the converted voltage to a plurality of data lines (DL), and drives the plurality of data lines (DL).

The data driver 130 may include at least one source driver integrated circuit, and may drive the plurality of data lines (DL).

Each source driver integrated circuit may be connected to a bonding pad of the display panel 110 based on a tape automated bonding (TAB) scheme or a chip on glass (COG) scheme, may be directly disposed in the display panel 110, or may be disposed by being integrated with the display panel 110.

Also, each source driver integrated circuit may be embodied based on a chip on film (COF) scheme. In this instance, one end of each source driver integrated circuit may be bonded to at least one source printed circuit board, and the other end may be bonded to the display panel 110.

The controller 140 may receive, from the outside (e.g., a host system), various timing signals including a vertical synchronization signal (Vsync), a horizontal synchronization signal (Hsync), an input data enable (DE) signal, a clock signal (CLK), and the like, together with input image data.

The controller 140 converts image data input from the outside to be appropriate for a data signal format used by the data driver 130, and outputs the converted image data. In addition, to control the gate driver 120 and the data driver 130, the controller 140 may: receive a timing signal, such as a vertical synchronization signal (Vsync), a horizontal synchronization signal (Hsync), an input data enable signal (DE), a clock signal (CLK), and the like; generate various control signals; and output the same to the gate driver 120 and the data driver 130.

For example, to control the gate driver 120, the controller 140 may output various gate control signals (GCS) including a gate start pulse (GSP), a gate shift clock (GSC), a gate output enable (GOE) signal, and the like.

Here, the GSP controls an operation start timing of one or more gate driver integrated circuits that form the gate driver 120. The GSC is a clock signal that is commonly input to one or more gate driver integrated circuits, and may control a shift timing of a scan signal. The GOE signal designates timing information of one or more gate driver integrated circuits.

Also, to control the data driver 130, the controller 140 may output various data control signals (DCS) including a source start pulse (SSP), a source sampling clock (SSC), a source output enable (SOE) signal, and the like.

Here, the SSP controls a data sampling start timing of one or more source driver integrated circuits that form the data driver 130. The SSC is a clock signal that controls a sampling timing of data in each source driver integrated circuit. The SOE controls an output timing of the data driver 130.

The controller 140 may be disposed in a control printed circuit board that is connected with a source printed circuit board to which a source driver integrated circuit is bonded, through a connection medium, such as a flexible flat cable (FFC) or a flexible printed circuit (FPC).

In the control printed circuit board, a power controller (not illustrated) may be further disposed that supplies various voltages or currents to the display panel 110, the gate driver 120, the data driver 130, and the like, or controls various voltages or currents to be supplied. The power controller is also referred to as a power management integrated circuit (IC).

Figure 3:
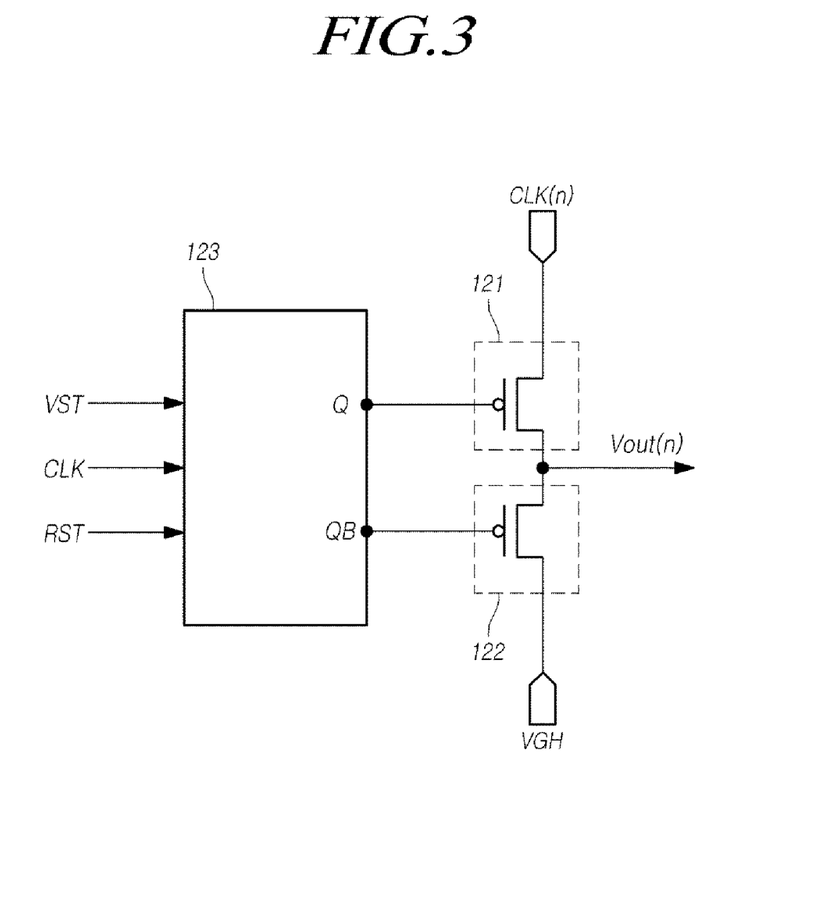

FIG. 3 is a diagram illustrating an example of a gate driver integrated circuit included in the gate driver 120.

Referring to FIG. 3, the gate driver integrated circuit included in the gate driver 120 may include a pull-down transistor 121, a pull-up transistor 122, a control circuit unit 123, and the like.

Although FIG. 3 illustrates the pull-down transistor 121 and the pull-up transistor 122 as P type transistors, N type transistors may alternatively be applied in one or more embodiments.

The pull-down transistor 121 is electrically connected between a clock signal input end and a scan signal output end, may be turned on by a voltage of a Q node of the control circuit unit 123, and may output a clock signal having a low level voltage as a scan signal when turned on.

A gate node of the pull-down transistor 121 is electronically connected with the Q node. A source node or a drain node of the pull-down transistor 121 is electronically connected with the clock signal input end, and receives a clock signal CLK(n) having a low level voltage. Also, the drain node or the source node of the pull-down transistor is connected with the scan signal output end to which a scan signal Vout(n) is output.

The pull-down transistor 121 is turned on by the voltage of the Q node, outputs, as a scan signal of a low level, a low level voltage in a low level section of a clock signal, and supplies the scan signal of the low level to a gate line (GL) that is electronically connected with the scan signal output end.

The pull-up transistor 122 is electronically connected between the scan signal output end and a gate high voltage (VGH), is turned on by a voltage of a QB node of the control circuit unit 123, and outputs a scan signal of a high level to the scan signal output end when turned on.

A gate node of the pull-up transistor 122 is electronically connected with the QB node. A source node or a drain node of the pull-up transistor 122 is electronically connected with the base voltage input end, and receives a gate high voltage (VGH) corresponding to a constant voltage. Also, the drain node or the source node of the pull-up transistor 122 is electronically connected with the scan signal output end to which a scan signal Vout(n) is output.

The pull-up transistor 122 is turned on by a voltage of the QB node, outputs a scan signal of a high level, and supplies the scan signal of the high level to the gate line (GL) that is electronically connected with the scan signal output end. Here, a scan signal of a high level may be, for example, the gate high voltage (VGH).

The control circuit unit 123 may include an internal circuit including two or more transistors or the like, and the internal circuit further includes a main node, such as a Q node, a QB node, a set node (S node, also referred to as a start node), and the like. According to various implemenations, the internal circuit of the control circuit unit 123 may further include: a reset node to which a reset signal is input; an input node to which various voltages, such as a driving voltage and the like are input; or the like.

The Q node of the control circuit unit 123 is electronically connected with the gate node of the pull-down transistor 121, and is repeatedly charged and discharged.

The QB node of the control circuit unit 123 is electronically connected with the gate node of the pull-up transistor 122, and is repeatedly charged and discharged.

The set node in the control circuit unit 123 is provided with a gate start signal (VST) indicating the start of driving a gate of a corresponding gate driver integrated circuit. Here, the gate start signal (VST) may be a signal provided by feeding back a scan signal that is output from a gate driver integrated circuit that is 1, 2, or 4 gate lines ahead of a present gate line (GL), based on the number of phases of a clock signal.

Figure 4:
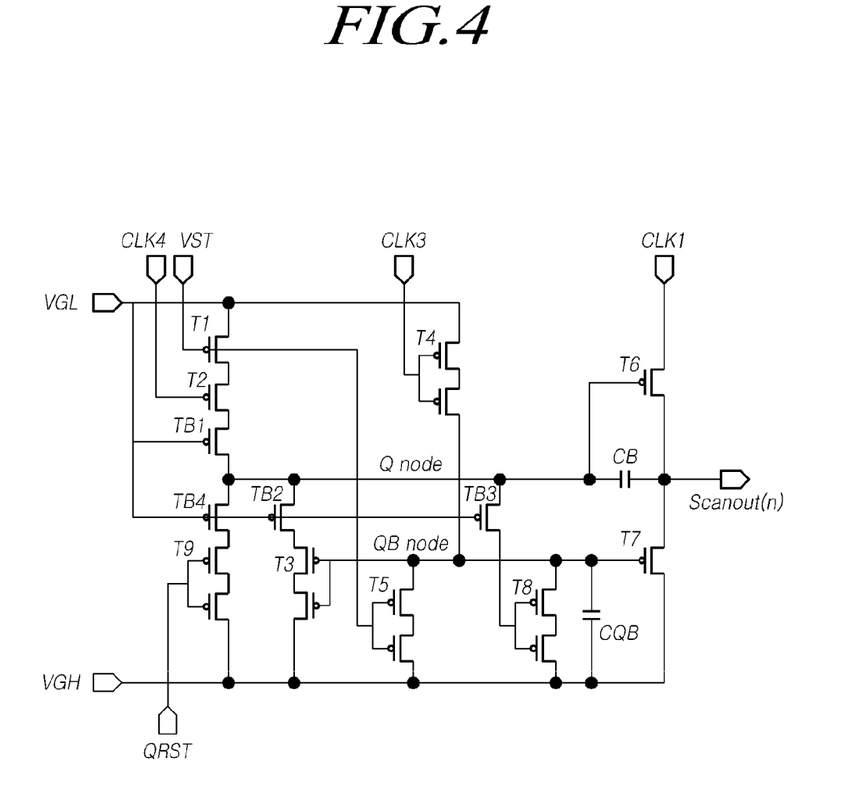
FIG. 4 is a diagram illustrating an example of a structure of a circuit of a gate driver according to embodiments of the present disclosure.

FIG. 4 illustrates an example of the detailed configuration of the gate driver integrated circuit of FIG. 3.

Referring to FIG. 4, transistor T6 corresponds to the pull-down transistor 121, and transistor T7 corresponds to the pull-up transistor 122. The remaining part of the circuit corresponds to the control circuit unit 123.

The gate node of the transistor T6 corresponding to the pull-down transistor 121 is connected with a Q node, and is turned on based on a voltage of the Q node. A source node or a drain node of the transistor T6 is connected with a first-clock signal input end, and the drain node or the source node of the transistor T6 is connected with a scan signal output end.

When the transistor T6 is turned on based on the voltage of the Q node, the transistor T6 outputs a first clock signal CLK1 to the scan signal output end.

A gate node of the transistor T7 corresponding to the pull-up transistor 122 is connected with a QB node, and is turned on based on a voltage of the QB node. When the transistor T7 is turned on based on the voltage of the QB node, the transistor T7 outputs a scan signal of a high level (e.g., the gate high voltage (VGH)) to the scan signal output end.

The control circuit unit 123 receives an input, such as a gate start signal (VST), a reset signal (QRST) for resetting the Q node, a gate high voltage (VGH), a gate low voltage (VGL), one or more clock signals (CLK), and the like, and controls voltage levels of the Q node and the QB node based on an input signal.

By controlling the voltage levels of the Q node and the QB node, operations of the transistor T6 and the transistor T7 are controlled, and a scan signal Scanout(n) is output to a gate line (GL) that is connected with the scan signal output end.

In the structure of a gate driver integrated circuit, the voltage levels of the Q node and the QB node may become unstable during a blank structure (e.g., a blank section between frames), and outputting a scan signal may be affected.

Figure 5:
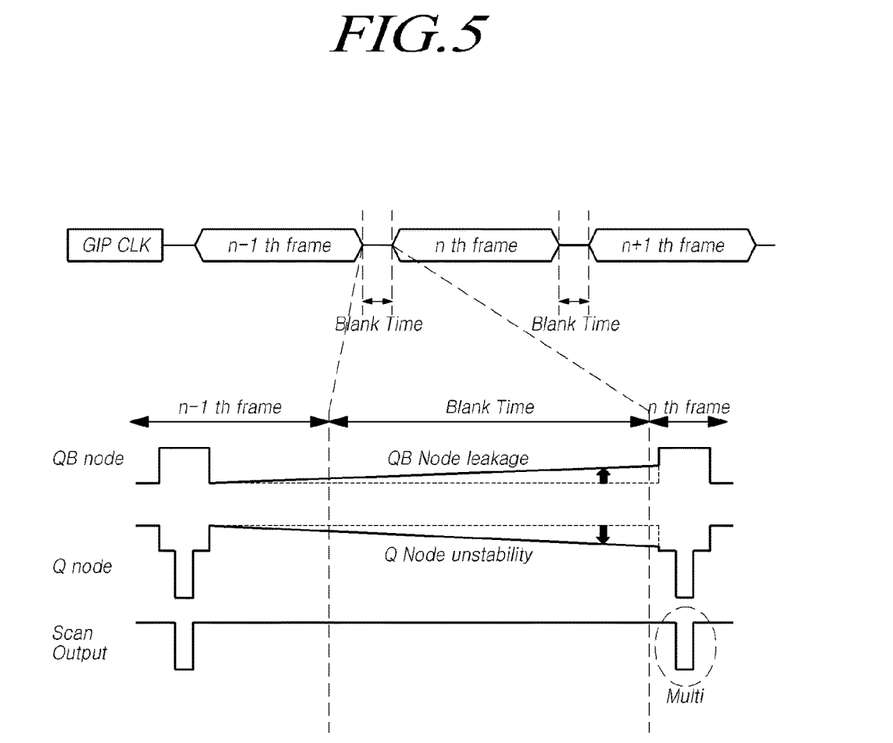
FIG. 5 is a diagram illustrating an example of voltage levels of a Q node and a QB node in a gate driver according to embodiments of the present disclosure.

FIG. 5 illustrates an example of voltage levels of a Q node and a QB node in a gate driver integrated circuit (e.g., as shown in FIG. 4).

Referring to FIG. 5, a voltage of a QB node may increase due to the leakage of the QB node during a blank section between frames.

As the voltage of the QB node increases, the Q node may fail to maintain a high level and become unstable. Due to the instability of the voltage of the Q node, a first clock signal is output to a scan signal output end, and a multi-scan may be generated.

According to various embodiments, there is provided a structure of a gate driver integrated circuit that prevents an error of a scan signal from occurring by maintaining the voltages of the Q node and the QB node to be stable during a blank section, and a method of driving the same is provided.

Figure 6:
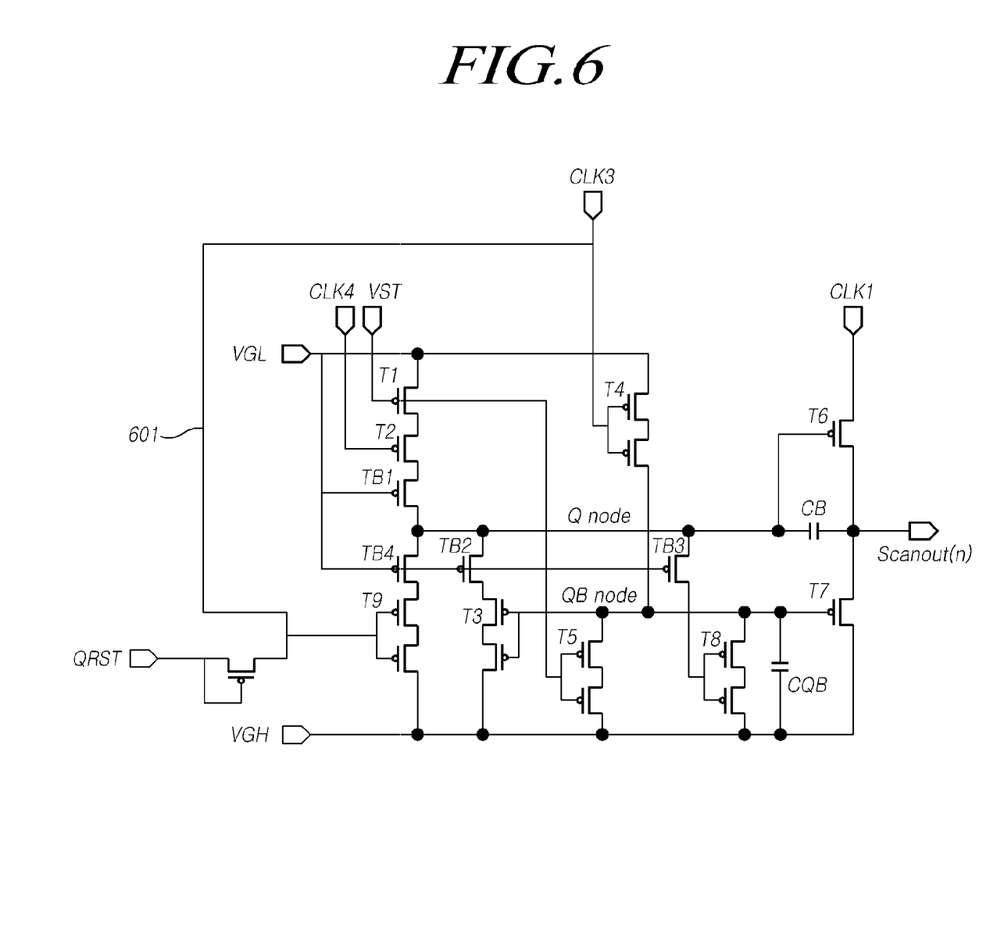
FIGS. 6 and 7 are diagrams illustrating a structure of a circuit of a gate driver according to embodiments of the present disclosure.
Figure 7:
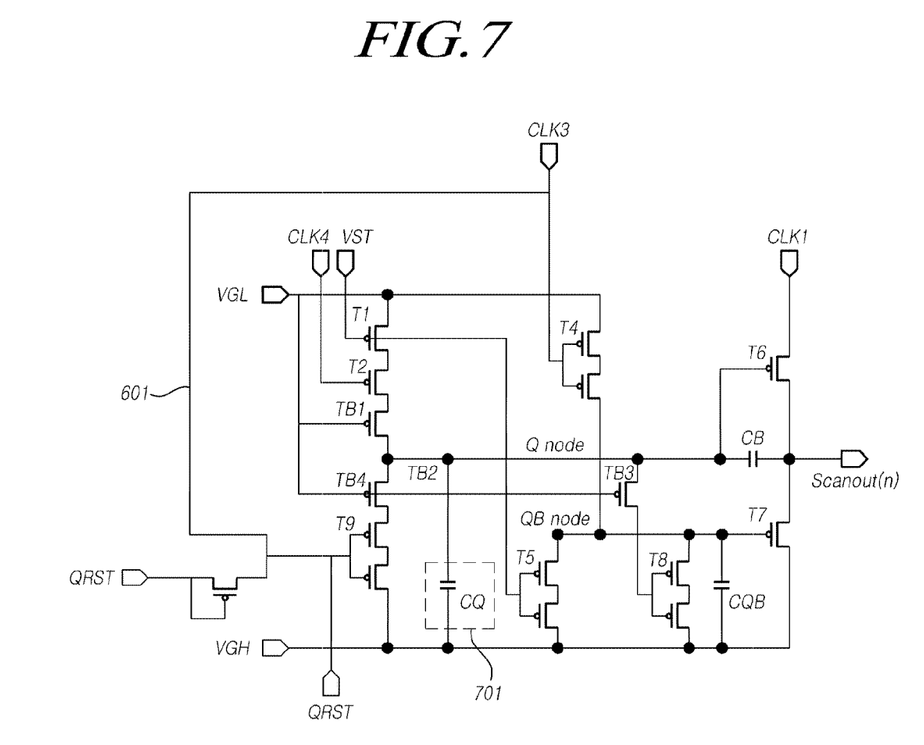

FIGS. 6 and 7 are diagrams illustrating a structure of a gate driver integrated circuit according to a first embodiment of the present disclosure.

Referring to FIG. 6, a gate driver integrated circuit according to the first embodiment of the present disclosure includes: transistor T6 which corresponds to the pull-down transistor 121; transistor T7 which corresponds to the pull-up transistor 122; and the control circuit unit 123 that controls outputting of a scan signal by controlling voltage levels of a Q node and a QB node.

In the control circuit unit 123, a third clock signal input end of a third clock signal CLK3 that provides a high level to the Q node is connected with a signal line to which a reset signal (QRST) for resetting the Q node is input, as shown at 601.

A transistor may be connected with the signal line to which a reset signal (QRST) is input, and a drain node and a gate node of the transistor may be connected with each other.

As the third clock signal is provided through the signal line to which a reset signal (QRST) is input, the Q node may maintain a high level in a blank section.

When a third clock signal is provided through a reset signal (QRST) input end, the voltage of a Q node may be maintained to be stable. Therefore, an error of a scan signal is not generated and a scan signal may be normally output.

That is, the third clock signal that provides a high level to the Q node is input into the reset signal (QRST) input end. The connection 601 of FIG. 6 illustrates an exemplary embodiment, and the present embodiments include all structures that provide a third clock signal to the reset signal (QRST) input end.

Also, a capacitor may be applied between the Q node and a gate high voltage (VGH) input end in the circuit structure of FIG. 6.

FIG. 7 illustrates an example of another structure of a gate driver integrated circuit according to one or more embodiments of the present disclosure.

Referring to FIG. 7, it is a structure that eliminates, from the circuit structure of FIG. 6, transistor T3 (which may include a grouping of three separate transistors, as shown in FIG. 6), which is connected between the gate high voltage (VGH) input end and the Q node, and of which the gate node is connected with the QB node.

A capacitor CQ is disposed in place of the eliminated transistor T3 at the location of the eliminated transistor T3. As such, the voltage level of the Q node is maintained to be stable by applying the capacitor CQ between the gate high voltage (VGH) and the Q node, and thus, a gate driver integrated circuit may normally output a scan signal.

Therefore, the circuit structure of a gate driver integrated circuit according to one or more embodiment is configured to provide a third clock signal through a signal line to which a reset signal (QRST) for resetting the Q node is input, and thus, may maintain the voltage level of the Q node to be stable, and may normally output a scan signal.

Also, by eliminating the transistor T3 that is connected between the gate high voltage (VGH) input end and the Q node, and connecting the capacitor CQ, the voltage level of the Q node may be maintained to be stable in a blank section.

The present embodiments provide a scheme of maintaining the voltage levels of the Q node and the QB node to be stable by changing a driving scheme of a gate driver integrated circuit, in addition to a structure that provides a third clock signal through the reset signal (QRST) input end.

Figure 8:
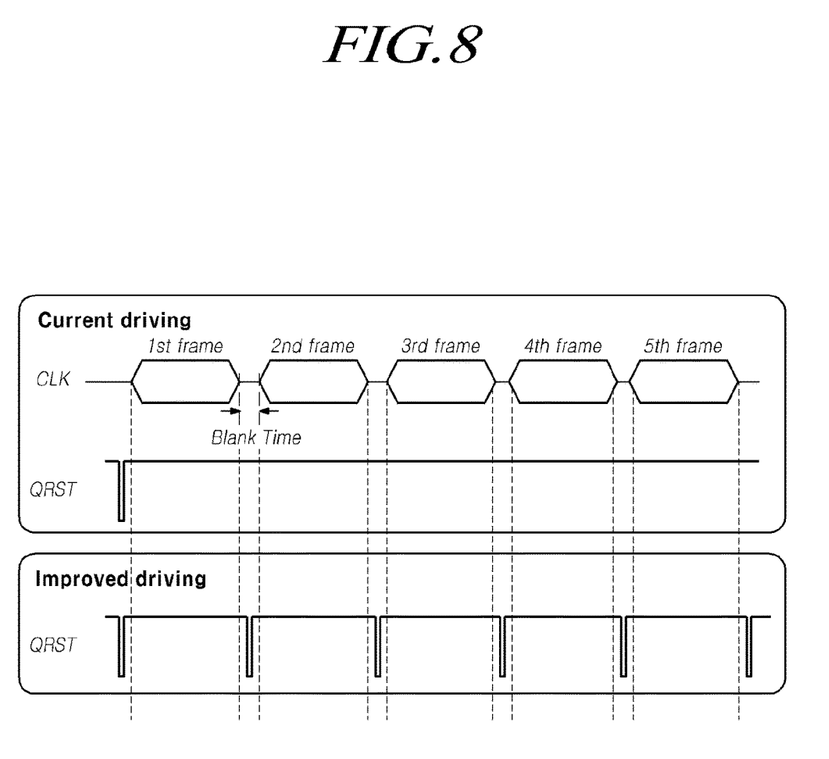
FIGS. 8 and 9 are diagrams illustrating a method of driving a gate driver according to embodiments of the present disclosure.
Figure 9:
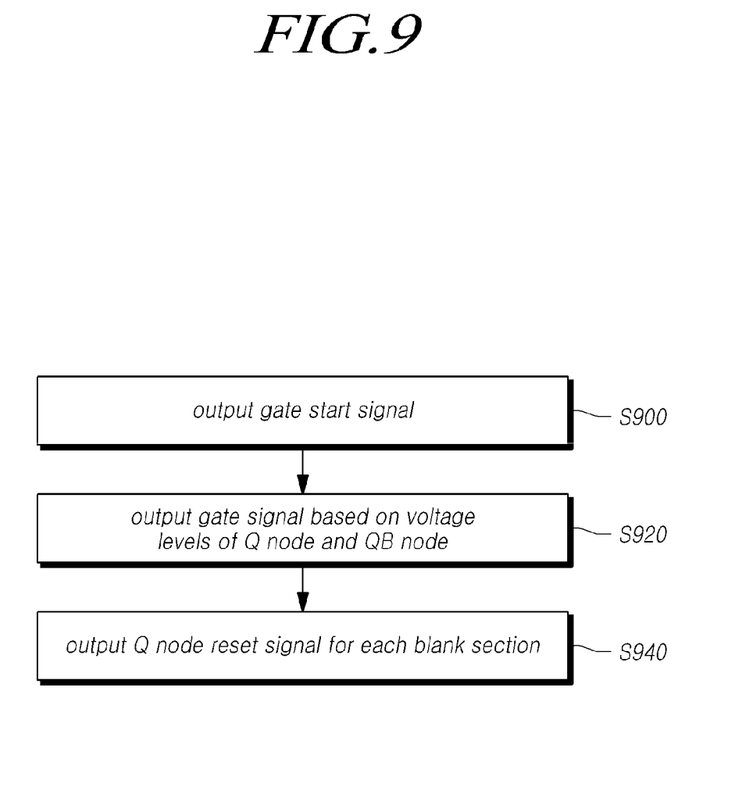

FIGS. 8 and 9 are diagrams illustrating a method of driving a gate driver integrated circuit according to embodiments of the present disclosure.

Referring to FIG. 8, a reset signal (QRST) for resetting a Q node may be output for each blank between frames.

Although the reset signal (QRST) is a signal that is output once before driving a screen for resetting the Q node, the reset signal (QRST) may be output for each blank section after an initial frame in one or more embodiments of the present disclosure.

When a reset signal (QRST) is output for each blank section between frames and the Q node is reset, the voltage of the Q node is maintained to be stable in the blank section.

By maintaining the voltage level of the Q node to be stable in the blank section, a malfunction in which a scan signal is erroneously output in a subsequent frame after the blank section is prevented and a gate driver integrated circuit normally generates a scan signal.

FIG. 9 illustrates a method of driving a gate driver integrated circuit according to embodiments of the present disclosure.

Referring to FIG. 9, a gate driver integrated circuit receives a gate start signal (VST), and starts operation in operation S900.

Here, the gate start signal (VST) may be a signal provided by feeding back a scan signal output from a previous gate driver integrated circuit.

The gate driver integrated circuit receives a gate start signal (VST) and starts operation, and outputs a scan signal (gate signal) based on voltage levels of a Q node and a QB node in operation S920.

The transistor T6, which is the pull-down transistor 121, operates based on the voltage level of the Q node, and outputs a first clock signal. The transistor T7, which is the pull-up transistor 122, operates based on the voltage level of the QB node, and outputs a scan signal of a high level (e.g., gate high voltage (VGH)).

The gate driver integrated circuit outputs a scan signal, and outputs a reset signal (QRST) for resetting the Q node, for each blank section between frames in operation S940.

By outputting the reset signal (QRST) for resetting the Q node for each blank section, the voltage level of the Q node may be maintained to be stable in the blank section. By maintaining the voltage level of the Q node to be stable in the blank section, a malfunction in which a scan signal is erroneously output in a subsequent frame may be prevented from occurring.

The present embodiments provide a scheme of avoiding an error of a scan signal by adjusting a gate high voltage (VGH) and a gate low voltage (VGL), in addition to a scheme of using a third clock signal or a reset signal (QRST).

Figure 10:
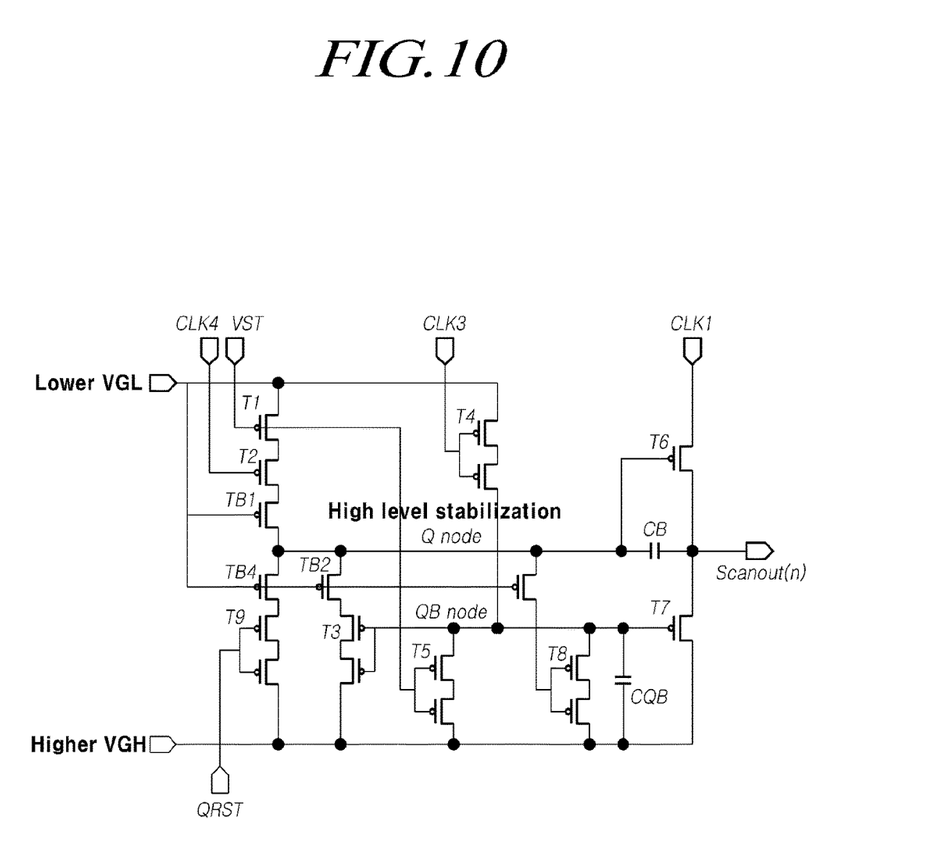
FIG. 10 is a diagram illustrating a method of driving a gate driver according to embodiments of the present disclosure.

FIG. 10 is a diagram illustrating a method of driving a gate driver integrated circuit according to embodiments of the present disclosure.

Referring to FIG. 10, a gate high voltage (VGH) that is higher than a reference gate high voltage (VGH_ref) is provided to a gate high voltage (VGH) input end, and a gate low voltage (VGL) that is lower than a reference gate low voltage (VGL_ref) is simultaneously provided to a gate low voltage (VGL) input end.

That is, by adjusting power input to the gate driver integrated circuit, the voltage levels of a Q node and a QB node are maintained to be stable and an error of a scan signal may be prevented.

Table 1 and Table 2 provided below are the results of testing whether a normal waveform is output when a gate high voltage (VGH) and a gate low voltage (VGL) are adjusted.

TABLE 1

| Voltage(V) | Driving GIP | note |
|---|---|---|
| 13.5 | NG | |
| 14.5 | NG | VGH_ref |
| 15.5 | OK | |

TABLE 2

| Voltage(V) | Driving GIP | note |
|---|---|---|
| −8.2 | NG | |
| −8.8 | NG | VGL_ref |
| −9.4 | NG | |
| −10.0 | OK | |

This is a result that determines that a normal waveform is output (i.e., the driving GIP output indicated by "OK") when a gate high voltage (VGH) of 15.5V is provided, which is higher than the reference gate high voltage (VGH_ref), and a gate low voltage (VGL) of −10.0 V is provided, which is lower than the reference gate low voltage (VGL_ref). In contrast, the results show that a normal waveform is not output (i.e., the driving GIP output indicated by "NG") when the reference gate high voltage (VGH_ref) or at the reference gate low voltage (VGL_ref) are provided.

Therefore, according to the present embodiments, by adjusting a signal or power source that is input into a gate driver integrated circuit, the voltage levels of the Q node and the QB node are maintained to be stable in a blank section.

Through the above, an error of a scan signal is prevented from occurring in a subsequent frame of the blank section, and a gate driver integrated circuit is provided that normally outputs a scan signal.

Figure 11:
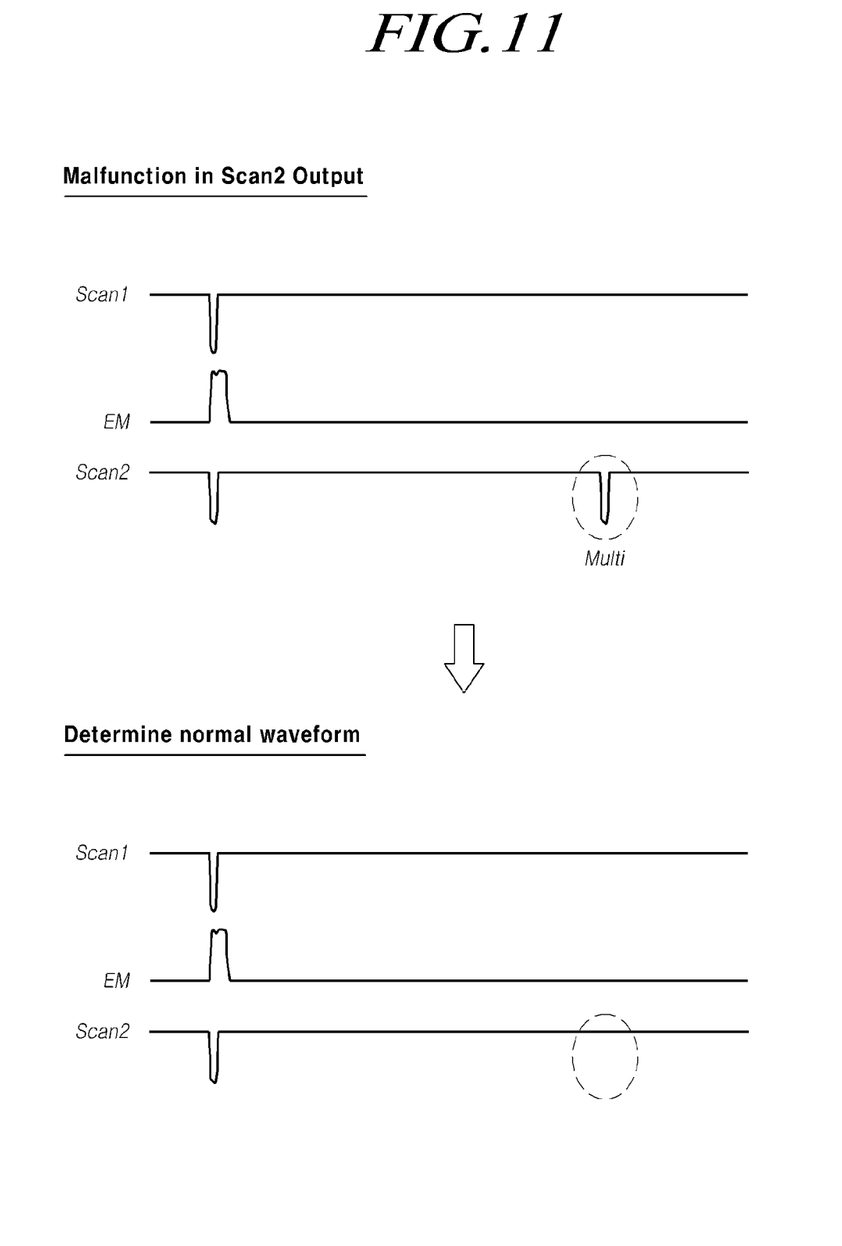
FIG. 11 is a diagram illustrating a scan signal improved in a gate driver according to embodiments of the present disclosure.

FIG. 11 illustrates a result that improves the waveform of a scan signal when the structure of a gate driver integrated circuit or a driving scheme according to the above described embodiments are applied.

Referring to FIG. 11, when the voltage levels of the Q node and the QB node of the gate driver integrated circuit are not stably controlled, it is determined that a multi-scan is generated from Scan2.

According to embodiments of the present disclosure, when a third clock signal is provided through a reset signal (QRST) input end for resetting the Q node, when the reset signal (QRST) is provided for each blank section between frames, or when a higher gate high voltage (VGH) and a lower gate low voltage (VGL) are provided, it is determined that a normal waveform is output, as opposed to a multi-scan.

According to the embodiments of the present disclosure, by adjusting a signal or power source that is input into a gate driver integrated circuit, the voltage levels of the Q node and the QB node are maintained to be stable in a blank section.

By maintaining the voltage levels of the Q node and the QB node to be stable in the blank section, a malfunction, such as a multi-scan, may not be generated in a subsequent frame after the blank section.

Through the improvement of a gate driver integrated circuit, the Q node and the QB node are maintained to be stable and the malfunction is prevented. Accordingly, a gate driver integrated circuit having a robust structure with high reliability and a driving method thereof may be provided.

Although preferred embodiments of the present disclosure have been described for illustrative purposes, those skilled in the art will appreciate that various modifications, additions and substitutions are possible, without departing from the scope and spirit of the disclosure as disclosed in the accompanying claims. Therefore, exemplary embodiments of the present disclosure have been described for the sake of brevity and clarity. The scope of the present disclosure shall be construed on the basis of the accompanying claims in such a manner that all of the technical ideas included within the scope equivalent to the claims belong to the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A gate driver, comprising:
   a first transistor that is connected with a Q node, and is configured to operate based on a voltage level of the Q node and to control outputting of a first clock signal;
   a second transistor that is connected with a QB node, and is configured to operate based on a voltage level of the QB node; and
   a control circuit unit that includes the Q node and the QB node, and is configured to control voltage levels of the Q node and the QB node, the control circuit unit further including a signal line, to which a reset signal for resetting the Q node is input, the signal line being connected with an input end of another clock signal that provides a high level to the Q node,
   wherein the control circuit unit includes a third transistor that is connected with the signal line to which the reset signal is input,
   wherein the signal line is directly connected to a gate node of the third transistor,
   wherein the control circuit unit includes a fourth transistor that is connected between a gate low voltage input end and the QB node, and the fourth transistor is connected with the input end of the another clock signal.

2. The gate driver of claim 1, wherein a drain node and the gate node of the third transistor are connected with each other.

3. The gate driver of claim 1, wherein the control circuit unit includes a capacitor that is connected between a gate high voltage input end and the Q node.

4. The gate driver of claim 1, wherein the fourth transistor is controlled by the another clock signal.

5. The gate driver of claim 1, wherein the control circuit unit maintains a voltage of the Q node to be stable during a blank section, by the another clock signal input through the signal line to which the reset signal is input.

6. The gate driver of claim 1, wherein the control circuit unit provides a gate high voltage that is a predetermined voltage higher than a reference gate high voltage, and simultaneously provides a gate low voltage that is a predetermined voltage lower than a reference gate low voltage.

7. The gate driver of claim 6, wherein the gate high voltage is equal to or greater than about 15.5V, and the gate low voltage is equal to or less than about −10V.

8. A gate driver, comprising:
   a first transistor that is connected with a Q node, and is configured to operate based on a voltage level of the Q node and to control outputting of a first clock signal;
   a second transistor that is connected with a QB node, and is configured to operate based on a voltage level of the QB node; and
   a control circuit unit that includes the Q node and the QB node, and is configured to control voltage levels of the Q node and the QB node and to output a reset signal for resetting the Q node for each blank section between frames to maintain a voltage of the Q node and a voltage of the QB node to be stable during the blank sections.

9. The gate driver of claim 8, wherein the control circuit unit provides a gate high voltage that is a predetermined voltage higher than a reference gate high voltage, and simultaneously provides a gate low voltage that is a predetermined voltage lower than a reference gate low voltage.

10. The gate driver of claim 9, wherein the gate high voltage is equal to or greater than about 15.5V, and the gate low voltage is equal to or less than about −10V.

11. A display device, comprising:
    a display panel in which a plurality of gate lines and a plurality of data lines are disposed;
    a gate driver configured to drive the plurality of gate lines; and
    a data driver configured to drive the plurality of data lines,
    wherein the gate driver is configured to output a gate line scan signal based on a voltage level of a Q node and a voltage level of a QB node, and a signal line, to which a reset signal for resetting the Q node is input, is connected with a clock signal input end of a clock signal that provides a high level to the Q node,
    wherein the gate driver includes a transistor that is connected with the signal line to which the reset signal is input,
    wherein the signal line is directly connected to a gate node of the transistor,
    wherein the gate driver further includes another transistor that is connected between a gate low voltage input end and the QB node, and the another transistor is connected with the clock signal input end of the clock signal.

12. The display device of claim 11, wherein a drain node and a gate node of the transistor are connected with each other.

13. The display device of claim 11, wherein the gate driver includes a capacitor that is connected between a gate high voltage input end and the Q node.

14. The display device of claim 11, wherein the gate driver maintains a voltage of the Q node to be stable during a blank section by the clock signal provided through the signal line to which the reset signal is input.

15. A method of driving a gate driver, comprising:
    providing a gate start signal to the gate driver;
    outputting, by the gate driver, a gate signal based on a voltage level of a Q node and a voltage level of a QB node; and
    resetting the Q node for each blank section between frames,
    wherein the gate driver provides a signal line, to which a reset signal for the resetting of the Q node is input, the signal line being connected with an input end of a clock signal that provides a high level to the Q node,
    wherein the gate driver includes a first transistor that is connected between a gate low voltage input end and the QB node, and the first transistor is connected with the input end of the clock signal,
    wherein the gate driver includes a second transistor that is connected with the signal line to which the reset signal is input,
    wherein the signal line is directly connected to a gate node of the second transistor.

16. The method of claim 15, wherein providing a gate start signal to the gate driver includes:
   providing the gate start signal to the gate driver by feeding back another gate signal output by another gate driver.

17. The method of claim 15, wherein resetting the Q node for each blank section between frames includes:
   providing the reset signal to one or more transistors coupled between the Q node and a gate high voltage node.

18. The method of claim 17, wherein providing the reset signal to the one or more transistors includes:
   providing the reset signal by providing a clock signal to control terminals of the one or more transistors.

19. The method of claim 17, further comprising:
   maintaining the voltage level of the Q node and the voltage level of the QB node to be stable during the blank sections between frames.

\* \* \* \* \*